(12) United States Patent
Kaeding et al.

(10) Patent No.: US 8,368,179 B2
(45) Date of Patent: Feb. 5, 2013

(54) MISCUT SEMIPOLAR OPTOELECTRONIC DEVICE

(75) Inventors: John F. Kaeding, Mountain View, CA (US); Dong-Seon Lee, Anyang-Si (KR); Michael Iza, Santa Barbara, CA (US); Troy J. Baker, Raleigh, NC (US); Hitoshi Sato, Kanagawa (JP); Benjamin A. Haskell, Santa Barbara, CA (US); James S. Speck, Goleta, CA (US); Steven P. DenBaars, Goleta, CA (US); Shuji Nakamura, Santa Barbara, CA (US)

(73) Assignees: The Regents of the University of California, Oakland, CA (US); Japan Science and Technology Agency, Saitama Prefecture (JP)

( * ) Notice: Subject to any disclaimer, the term of this patent is extended or adjusted under 35 U.S.C. 154(b) by 0 days.

(21) Appl. No.: 13/311,986

(22) Filed: Dec. 6, 2011

(65) Prior Publication Data

US 2012/0074525 A1    Mar. 29, 2012

Related U.S. Application Data

(63) Continuation of application No. 12/710,181, filed on Feb. 22, 2010, now Pat. No. 8,110,482, which is a continuation of application No. 11/655,573, filed on Jan. 19, 2007, now Pat. No. 7,691,658.

(60) Provisional application No. 60/760,739, filed on Jan. 20, 2006.

(51) Int. Cl.
    *H01L 29/20*    (2006.01)

(52) U.S. Cl. ........... 257/615; 257/E33.06; 257/E29.089; 438/22; 117/84

(58) Field of Classification Search ........... 438/22, 438/46, 478, 503; 257/615, 631, E29.089
See application file for complete search history.

(56) References Cited

U.S. PATENT DOCUMENTS

| | | | |
|---|---|---|---|
| 4,855,249 A | 8/1989 | Akasaki et al. |
| 5,716,450 A | 2/1998 | Togawa et al. |
| 5,741,724 A | 4/1998 | Ramdani et al. |
| 6,039,803 A | 3/2000 | Fitzgerald et al. |
| 6,064,082 A | 5/2000 | Kawai et al. |
| 6,133,593 A | 10/2000 | Boos et al. |
| 6,153,010 A | 11/2000 | Kiyoku et al. |
| 6,218,280 B1 | 4/2001 | Kryliouk et al. |
| 6,316,785 B1 | 11/2001 | Nunoue et al. |
| 6,440,823 B1 | 8/2002 | Vaudo et al. |
| 6,586,819 B2 | 7/2003 | Matsuoka |
| 6,599,362 B2 | 7/2003 | Ashby et al. |

(Continued)

FOREIGN PATENT DOCUMENTS

| | | |
|---|---|---|
| EP | 0383215 | 8/1990 |
| EP | 1385196 | 1/2004 |

(Continued)

OTHER PUBLICATIONS

PCT International Search Report and Written Opinion dated Oct. 1, 2007 (Application No. PCT/US2007/001699).

(Continued)

*Primary Examiner* — Leonard Chang
(74) *Attorney, Agent, or Firm* — Gates & Cooper LLP

(57) ABSTRACT

A method for improved growth of a semipolar (Al,In,Ga,B)N semiconductor thin film using an intentionally miscut substrate. Specifically, the method comprises intentionally miscutting a substrate, loading a substrate into a reactor, heating the substrate under a flow of nitrogen and/or hydrogen and/or ammonia, depositing an $In_xGa_{1-x}N$ nucleation layer on the heated substrate, depositing a semipolar nitride semiconductor thin film on the $In_xGa_{1-x}N$ nucleation layer, and cooling the substrate under a nitrogen overpressure.

39 Claims, 5 Drawing Sheets

U.S. PATENT DOCUMENTS

| | | |
|---|---|---|
| 6,608,328 B2 | 8/2003 | Kuo et al. |
| 6,624,452 B2 | 9/2003 | Yu et al. |
| 6,847,057 B1 | 1/2005 | Gardner et al. |
| 6,900,070 B2 | 5/2005 | Craven et al. |
| 7,091,514 B2 | 8/2006 | Craven et al. |
| 7,186,302 B2 | 3/2007 | Chakraborty et al. |
| 7,220,324 B2 | 5/2007 | Baker et al. |
| 7,220,658 B2 | 5/2007 | Haskell et al. |
| 7,361,576 B2 | 4/2008 | Imer et al. |
| 2001/0009134 A1 | 7/2001 | Kim et al. |
| 2001/0015437 A1 | 8/2001 | Ishii et al. |
| 2001/0020700 A1 | 9/2001 | Inoue et al. |
| 2002/0069817 A1 | 6/2002 | Mishra et al. |
| 2002/0144645 A1 | 10/2002 | Kim et al. |
| 2003/0006407 A1 | 1/2003 | Taylor |
| 2003/0022525 A1 | 1/2003 | Droopad et al. |
| 2003/0024475 A1 | 2/2003 | Anderson |
| 2003/0170503 A1* | 9/2003 | Shibata et al. ............ 428/698 |
| 2003/0198837 A1 | 10/2003 | Craven et al. |
| 2003/0230235 A1 | 12/2003 | Craven et al. |
| 2004/0251471 A1 | 12/2004 | Dwilinski et al. |
| 2004/0261692 A1 | 12/2004 | Dwilinski et al. |
| 2005/0142391 A1 | 6/2005 | Dmitriev et al. |
| 2005/0161697 A1 | 7/2005 | Nakahata et al. |
| 2005/0214992 A1 | 9/2005 | Chakraborty et al. |
| 2005/0245095 A1 | 11/2005 | Haskell et al. |
| 2005/0258451 A1 | 11/2005 | Saxler et al. |
| 2006/0008941 A1 | 1/2006 | Haskell et al. |
| 2006/0138431 A1 | 6/2006 | Dwilinski et al. |
| 2006/0270076 A1 | 11/2006 | Imer et al. |
| 2007/0015345 A1 | 1/2007 | Baker et al. |
| 2007/0093073 A1 | 4/2007 | Farrell et al. |
| 2007/0111531 A1 | 5/2007 | Baker et al. |

FOREIGN PATENT DOCUMENTS

| | | |
|---|---|---|
| JP | H10-341060 | 12/1998 |
| JP | 2001342100 | 12/2001 |
| JP | 2008-533723 | 8/2008 |
| WO | 03/089694 | 10/2003 |
| WO | 2004/003261 | 1/2004 |
| WO | 2006-099138 | 9/2006 |

OTHER PUBLICATIONS

Amano, H. et al., "Metalorganic vapor phase growth of a high quality GaN film using an AlN buffer layer," Appl. Phys. Lett., 1986, 48(5), pp. 353-355.

Aminer et al., "Single-crystal hexagonal and cubic GaN growth directly on vicinal (001) GaAs substrates by molecular-beam epitaxy," Applied Physics Letters, vol. 76, No. 18 (2000), pp. 2580-2582.

Baker, T. J., et al., "Characterization of Planar Semipolar Gallium Nitride Films on Spinel Substrates", Japanese Journal of Applied Physics, vol. 44, No. 28-32; 8 Jul. 2005, pp. L920-L922, XP002589644.

Bauer et al., "Optical properties of aluminum nitride prepared by chemical plastachemical vapour deposition," Physica Status Solidi (A), vol. 39, Jan. 16, 1977, pp. 173-181.

Chakraborty, A., et al., "Milliwatt Power Blue InGaN/GaN Light-Emitting Diodes on Semipolar GaN Templates", Japanese Journal of Applied Physics, Part 2 (Letters) Japan Soc. Appl. Phys. Japan, vol. 44, No. 28-32, Jul. 15, 2005, pp. L945-L947, XP002589643.

Chini et al., "Fabrication and characterization of n-face AlGaN/GaN/AlGaN HEMTs," Device Research Conference Digest, IEEE, Jun. 20, 2005, vol. 1, pp. 63-64.

Funato, M. et al., "Blue, Green, and Amber InGan/Gan Light Emitting Diodes on Semipolar {11-22} Gan Bulk Substrates," Jpn. J. of Appl. Phys., 2006, 45(26), pp. L659-L662.

Grudowski, P.A. et al., "The Effect of substrate misorientation on the photoluminescence properties of GaN grown on sapphire metalorganic chemical vapor deposition," App. Phys. Lett., 1996, 69(24), pp. 3626-3628.

Gu et al., "The impact of initial growth and substrate nitridation on thick GaN growth on sapphire by hydride vapor phase epitaxy," Journal of Crystal Growth, vol. 231, No. 3, Oct. 2001, pp. 342-351.

Haskell et al., "Defect reduction (1120) a-plane gallium nitride via lateral epitaxial overgrowth by hydride vapor phase epitaxy," Appl. Phys. Lett. 2003, 83(4); pp. 644-646.

Haskell et al., "Defect reduction in (1100) m-plane gallium nitride via lateral epitaxial overgrowth by hydride vapor-phase epitaxy," Appl. Phys. Lett. 2005, 86, pp. 111917-1-111917-3.

Hess, R. R., et al., "Lattice tilt and relaxation in InGaP/GaAs/Ge solar cells on miscut substrates", Journal of Physics D (Applied Physics, vol. 32, No. 10A, May 21, 1999, pp. A16-A20, XP002589719.

Hiramatsu, K. et al., "MOVPE Growth of GaN on a Misoriented Sapphire Substrate," J. Cryst. Growth, 1991, 107, pp. 509-512.

Hwang et al., "Heteroepitaxy of gallium nitride on (0001), (-1012) and (10-10) sapphire surfaces," Journal of Crystal Growth, vol. 142, Sep. 1, 1994, pp. 5-14.

Ilegems, "Vapor epitaxy of gallium nitride," Journal of Crystal Growth, vol. 13/14, May 1, 1972, pp. 360-364.

Iwaya, M., et al., "Reduction of Etch Pit Density in Organometallic Vapor Phase Epitaxy-Grown GaN on Sapphire by Insertion of a Low-Temperature-Deposited Buffer Layer between High-Temperature-Grown GaN", Japanese Journal of Applied Physics, Part 2, vol. 37, No. Part 2, 3B, Mar. 15, 1998, pp. L316-L318, XP009110309.

Kaeding, J. F. et al., "The heteroepitaxial growth of semipolar GaN for light emitting diodes," Thesis, University of California, Santa Barbara, Mar. 2007, pp. 1-143.

Kamiyama et al., "GaN growth on (30-38) 4H-SiC substrate for reduction of internal polarization," Physica Status Solidi, vol. 2, No. 7 (2005), pp. 2121-2124.

Koleske et al., "In situ measurement of GaN nucleation layer decomposition," Applied Physics Letters, vol. 82, No. 8, 2003, pp. 1170-1172.

Koleske et al., "Understanding GaN nucleation layer evolution on sapphire," J. Cryst. Growth, 273 (2004), pp. 86-99.

"Kyma Technologies Annouces Improved and Expanded Native Gallium Nitride Product Line," Mar. 20, 2006, Company News Releases, retrieved from http://www.compoundsemi.com/documents/articles/cldoc/6523.html.

Matsuoka, T., "GaN growth on novel lattice-matching substrate: Tilted m-plane sapphire," Phys. Stat. Sol. (a) 188, No. 2, 485-489 (2001).

McMahan, "Dr. Shuji Nakamura and UCSB research team report first nonpolar and semi-polar GaN LEDs," Compoundsemi Online, Mar. 24, 2006, one page.

Moran, B. et al., "Structural and morphological evolution of GaN grown by metalorganic chemical vapor deposition on SiC substrates using an AlN initial layer," J. Cryst. Growth, 2004, 273, pp. 38-47.

Morkoc et al., "Polarization effects in nitride semiconductor device structures and performances of modulation doped field effect transistors," Solid State Electronics, Oct. 1, 1999, vol. 43, No. 10, pp. 1909-1927.

Nakamura, S., "GaN Growth Using GaN Buffer Layer," Jpn. J. Appl. Phys., 1991, 30(10A), pp. L1705-L1707.

Neubert, "Growth characteristics of GaInN quantum wells on semipolar GaN facets," Annual Report 2005, Optoelectronics Department, University of Ulm 2005, pp. 1-6.

Nisihizuka, K., "Efficient radiative recombination from <1122>—oriented InxGa1-xn multiple quantum wells fabricated by the regrowth technique," Appl. Phys. Lett., 2004, 85(15), pp. 3122-3124.

Park et al., "Crystal orientation effects on many-body optical gain of wurtzite InGaN/GaN quantum well lasers," Japanese Journal of Applied Physics, vol. 42 (2003), pp. L170-L172.

Shao et al., "Electrical characterization of semipolar gallium nitride thin films," NNIN REU Research Accomplishments, Aug. 2005, pp. 132-133.

Sharma, "Demonstration of a semipolar (1013) InGaN/GaN green light emitting diode," Applied Physics Letters, Nov. 2005, vol. 87, 231110, pp. 1-3, abstract.

Tempel et al., "Zur epitaxie von Galliumnitrid auf nichtstochiometrischem Spinnel im system GaCl/NH3/He," vol. 10, 1975, pp. 747-758.

Van Zant, Microchip Fabrication, Fifth Edition, New York; McGraw-Hill, 2004, pp. 384-385.

Zandler et al., "Pyroelectornics: novel device concepts based on nitride interfaces," Journal of Vacuum Sciences & Technology B, Jul. 1, 1999, vol. 17, No. 4, pp. 1617-1621.

EP Search Report dated Sep. 17, 2010, EP Application 07718338.2.

JP Office Action dated Mar. 27, 2012, Application No. 2008-551465, with English translation.

George, T. et al., Novel symmetry in the growth of gallium nitride on magnesium aluminate substrates, Applied Physics Letters, American Institute of Physics, Jan. 15, 1996, vol. 68, No. 3, p. 337-339.

* cited by examiner

MISCUT SEMIPOLAR OPTOELECTRONIC DEVICE

CROSS-REFERENCE TO RELATED APPLICATIONS

This application is a continuation of and claims the benefit under 35 U.S.C. Section 120 of co-pending and commonly-assigned U.S Utility patent application Ser. No. 12/710,181, filed on Feb. 22, 2010, by John F. Kaeding, Dong-Seon Lee, Michael Iza, Troy J. Baker, Hitoshi Sato, Benjamin A. Haskell, James S. Speck, Steven P. DenBaars, and Shuji Nakamura, entitled "MISCUT SEMIPOLAR OPTOELECTRONIC DEVICE,", which application is a continuation of and claims the benefit under 35 U.S.C. Section 120 of U.S. Utility patent application Ser. No. 11/655,573, filed on Jan. 19, 2007, now U.S. Pat. No. 7,691,658, issued Apr. 6, 2010, by John F. Kaeding, Dong-Seon Lee, Michael Iza, Troy J. Baker, Hitoshi Sato, Benjamin A. Haskell, James S. Speck, Steven P. DenBaars, and Shuji Nakamura, entitled "METHOD FOR IMPROVED GROWTH OF SEMIPOLAR (Al,In,Ga,B)N,", which application claims the benefit under 35 U.S.C. Section 119(e) of U.S. Provisional Patent Application Ser. No. 60/760,739, filed on Jan. 20, 2006, by John Kaeding, Michael Iza, Troy J. Baker, Hitoshi Sato, Benjamin A. Haskell, James S. Speck, Steven P. DenBaars and Shuji Nakamura, entitled "METHOD FOR IMPROVED GROWTH OF SEMIPOLAR (Al,In,Ga,B)N", all of which applications are incorporated by reference herein.

This application is related to the following commonly-assigned application:

U.S. Utility patent application Ser. No. 11/372,914 filed Mar. 10, 2006, by Troy J. Baker, Benjamin A. Haskell, Paul T. Fini, Steven P. DenBaars, James S. Speck, and Shuji Nakamura, entitled "TECHNIQUE FOR THE GROWTH OF PLANAR SEMI-POLAR GALLIUM NITRIDE,", now U.S. Pat. No. 7,220,324, issued May 22, 2007, which application claims the benefit under 35 U.S.C. Section 119(e) of U.S. Provisional Patent Application Ser. No. 60/660,283, filed Mar. 10, 2005, by Troy J. Baker, Benjamin A. Haskell, Paul T. Fini, Steven P. DenBaars, James S. Speck, and Shuji Nakamura, entitled "TECHNIQUE FOR THE GROWTH OF PLANAR SEMI-POLAR GALLIUM NITRIDE,";

U.S. Utility patent application Ser. No. 11/444,946, filed Jun. 1, 2006, by Robert M. Farrell, Jr., Troy J. Baker, Arpan Chakraborty, Benjamin A. Haskell, P. Morgan Pattison, Rajat Sharma, Umesh K. Mishra, Steven P. DenBaars, James S. Speck, and Shuji Nakamura, entitled "TECHNIQUE FOR THE GROWTH AND FABRICATION OF SEMIPOLAR (Ga,Al,In,B)N THIN FILMS, HETEROSTRUCTURES, AND DEVICES," now U.S. Pat. No. 7,846,757, issued Dec. 7, 2010, which application claims the benefit under 35 U.S.C. Section 119(e) of U.S. Provisional Patent Application Ser. No. 60/686,244, filed Jun. 1, 2005, by Robert M. Farrell, Jr., Troy J. Baker, Arpan Chakraborty, Benjamin A. Haskell, P. Morgan Pattison, Rajat Sharma, Umesh K. Mishra, Steven P. DenBaars, James S. Speck, and Shuji Nakamura, entitled "TECHNIQUE FOR THE GROWTH AND FABRICATION OF SEMIPOLAR (Ga,Al,In,B)N THIN FILMS, HETEROSTRUCTURES, AND DEVICES,";

U.S. Utility patent application Ser. No. 11/486,224, filed Jul. 13, 2006, by Troy J. Baker, Benjamin A. Haskell, James S. Speck and Shuji Nakamura, entitled "LATERAL GROWTH METHOD FOR DEFECT REDUCTION OF SEMIPOLAR NITRIDE FILMS," which application claims the benefit under 35 U.S.C. Section 119(e) of U.S. Provisional Patent Application Ser. No. 60/698,749, filed Jul. 13, 2005, by Troy J. Baker, Benjamin A. Haskell, James S. Speck, and Shuji Nakamura, entitled "LATERAL GROWTH METHOD FOR DEFECT REDUCTION OF SEMIPOLAR NITRIDE FILMS,";

U.S. Utility patent application Ser. No. 11/517,797, filed Sep. 8, 2006, by Michael Iza, Troy J. Baker, Benjamin A. Haskell, Steven P. DenBaars, and Shuji Nakamura, entitled "METHOD FOR ENHANCING GROWTH OF SEMIPOLAR (Al,In,Ga,B)N VIA METALORGANIC CHEMICAL VAPOR DEPOSITION,", now U.S. Pat. No. 7,575,947, issued Aug. 18, 2004, which application claims the benefit under 35 U.S.C. Section 119(e) of U.S. Provisional Patent Application Ser. No. 60/715,491, filed Sep. 9, 2005, by Michael Iza, Troy J. Baker, Benjamin A. Haskell, Steven P. DenBaars, and Shuji Nakamura, entitled "METHOD FOR ENHANCING GROWTH OF SEMIPOLAR (Al,In,Ga,B)N VIA METALORGANIC CHEMICAL VAPOR DEPOSITION,";

U.S. Utility patent application Ser. No. 11/523,286, filed on Sep. 18, 2006, by Siddharth Rajan, Chang Soo Suh, James S. Speck and Umesh K. Mishra, entitled "N-POLAR ALUMINUM GALLIUM NITRIDE/GALLIUM NITRIDE ENHANCEMENT-MODE FIELD EFFECT TRANSISTOR," now U.S. Pat. No. 7,948,011, issued May 24, 2011, which application claims the benefit under 35 U.S.C. Section 119(e) of U.S. Provisional Patent Application Ser. No. 60/717,996, filed on Sep. 16, 2005, by Siddharth Rajan, Chang Soo Suh, James S. Speck and Umesh K. Mishra, entitled "N-POLAR ALUMINUM GALLIUM NITRIDE/ GALLIUM NITRIDE ENHANCEMENT-MODE FIELD EFFECT TRANSISTOR,";

U.S. Utility patent application Ser. No. 11/655,572, filed on Jan. 19, 2007, by Hitoshi Sato, John Kaeding, Michael Iza, Troy J. Baker, Benjamin A. Haskell, Steven P. DenBaars and Shuji Nakamura, entitled "METHOD FOR ENHANCING GROWTH OF SEMIPOLAR (Al,In,Ga,B)N VIA METALORGANIC CHEMICAL VAPOR DEPOSITION," now U.S. Pat. No. 7,687,293, issued Mar. 30, 2010, which application claims the benefit under 35 U.S.C. Section 119(e) of U.S. Provisional Patent Application Ser. No. 60/760,628 filed on Jan. 20, 2006, by Hitoshi Sato, John Kaeding, Michael Iza, Troy J. Baker, Benjamin A. Haskell, Steven P. DenBaars and Shuji Nakamura entitled "METHOD FOR ENHANCING GROWTH OF SEMIPOLAR (Al,In,Ga,B)N VIA METALORGANIC CHEMICAL VAPOR DEPOSITION";

U.S. Provisional Patent Application Ser. No. 60/772,184, filed on Feb. 10, 2006, by John F. Kaeding, Hitoshi Sato, Michael Iza, Hirokuni Asamizu, Hong Zhong, Steven P. DenBaars and Shuji Nakamura, entitled "METHOD FOR CONDUCTIVITY CONTROL OF SEMIPOLAR (Al,In,Ga,B)N,";

U.S. Provisional Patent Application Ser. No. 60/774,467, filed on Feb. 17, 2006, by Hong Zhong, John F. Kaeding, Rajat Sharma, James S. Speck, Steven P. DenBaars and Shuji Nakamura, entitled "METHOD FOR GROWTH OF SEMIPOLAR (Al,In,Ga,B) N OPTOELECTRONICS DEVICES,";

U.S. Provisional Patent Application Ser. No. 60/798,933, filed on May 9, 2006, by Arpan Chakraborty, Kwang-Choong Kim, Steven P. DenBaars, James S. Speck, and Umesh K. Mishra, entitled "TECHNIQUE FOR DEFECT REDUCTION IN NONPOLAR AND SEMIPOLAR GALLIUM NITRIDE FILMS USING IN-SITU SILICON NITRIDE NANOMASKING,";

U.S. Provisional Patent Application Ser. No. 60/809,774, filed on May 31, 2006, by Nicholas A. Fichtenbaum, Umesh K. Mishra, Carl J. Neufeld and Stacia Keller, entitled "OPTO-ELECTRONIC DEVICES FORMED BY REGROWTH ON N-POLAR NANOPILLAR AND NANOSTRIPE ARRAYS,";

U.S. Provisional Patent Application Ser. No. 60/866,035, filed on Nov. 15, 2006, by Stacia Keller, Umesh K. Mishra, and Nicholas A. Fichtenbaum, entitled "METHOD FOR HETEROEPITAXIAL GROWTH OF HIGH-QUALITY N-FACE GaN, InN, and AlN AND THEIR ALLOYS BY METAL ORGANIC CHEMICAL VAPOR DEPOSITION,";

U.S. Provisional Patent Application Ser. No. 60/869,540, filed on Dec. 11, 2006, by Steven P. DenBaars, Mathew C. Schmidt, Kwang Choong Kim, James S. Speck and Shuji Nakamura, entitled "NON-POLAR (M-PLANE) AND SEMI-POLAR EMITTING DEVICES,"; and U.S. Provisional Patent Application Ser. No. 60/869,701, filed on Dec. 12, 2006, by Kwang Choong Kim, Mathew C. Schmidt, Feng Wu, Asako Hirai, Melvin B. McLaurin, Steven P. DenBaars, Shuji Nakamura and James S. Speck, entitled "CRYSTAL GROWTH OF M-PLANE AND SEMIPOLAR PLANES OF (Al, In, Ga, B)N ON VARIOUS SUBSTRATES,";

all of which applications are incorporated by reference herein.

BACKGROUND OF THE INVENTION

1. Field of the Invention

The invention is related to a method for improved growth of semipolar (Al,In,Ga,B)N.

2. Description of the Related Art (Note: This application references a number of different publications and patents as indicated throughout the specification by one or more reference numbers within brackets, e.g., [x]. A list of these different publications and patents ordered according to these reference numbers can be found below in the section entitled "References." Each of these publications and patents is incorporated by reference herein.)

The usefulness of gallium nitride (GaN), and its ternary and quaternary compounds incorporating aluminum and indium (AlGaN, InGaN, AlInGaN), has been well established for fabrication of visible and ultraviolet optoelectronic devices and high-power electronic devices. These devices are typically grown epitaxially using growth techniques comprising molecular beam epitaxy (MBE), metalorganic chemical vapor deposition (MOCVD), and hydride vapor phase epitaxy (HVPE).

GaN and its alloys are most stable in the hexagonal würtzite crystal structure, in which the structure is described by two (or three) equivalent basal plane axes that are rotated 120° with respect to each other (the a-axes), all of which are perpendicular to a unique c-axis. Group III and nitrogen atoms occupy alternating c-planes along the crystal's c-axis. The symmetry elements included in the würtzite structure dictate that III-nitrides possess a bulk spontaneous polarization along this c-axis, and the würtzite structure exhibits piezoelectric polarization.

Current nitride technology for electronic and optoelectronic devices employs nitride films grown along the polar c-direction. However, conventional c-plane quantum well structures in III-nitride based optoelectronic and electronic devices suffer from the undesirable quantum-confined Stark effect (QCSE), due to the existence of strong piezoelectric and spontaneous polarizations. The strong built-in electric fields along the c-direction cause spatial separation of electrons and holes that in turn gives rise to restricted carrier recombination efficiency, reduced oscillator strength, and red-shifted emission.

One approach to eliminating the spontaneous and piezoelectric polarization effects in GaN optoelectronic devices is to grow the devices on nonpolar planes of the crystal. Such planes contain equal numbers of Ga and N atoms and are charge-neutral. Furthermore, subsequent nonpolar layers are crystallographically equivalent to one another so the crystal will not be polarized along the growth direction. Two such families of symmetry-equivalent nonpolar planes in GaN are the {11-20} family, known collectively as a-planes, and the {1-100} family, known collectively as m-planes. Unfortunately, despite advances made by researchers at the University of California, the assignee of the present invention, growth of nonpolar nitrides remains challenging and has not yet been widely adopted in the III-nitride industry.

Another approach to reducing or possibly eliminating the polarization effects in GaN optoelectronic devices is to grow the devices on semipolar planes of the crystal. The term semipolar planes can be used to refer to a wide variety of planes that possess two nonzero h, i, or k Miller indices, and a nonzero 1 Miller index. Some commonly observed examples of semipolar planes in c-plane GaN heteroepitaxy include the {11-22}, {10-11}, and {10-13} planes, which are found in the facets of pits. These planes also happen to be the same planes that the authors have grown in the form of planar films. Other examples of semipolar planes in the würtzite crystal structure include, but are not limited to, {10-12}, {20-21}, and {10-14}. The nitride crystal's polarization vector lies neither within such planes or normal to such planes, but rather lies at some angle inclined relative to the plane's surface normal. For example, the {10-11} and {10-13} planes are at 62.98° and 32.06° to the c-plane, respectively.

In addition to spontaneous polarization, the second form of polarization present in nitrides is piezoelectric polarization. This occurs when the material experiences a compressive or tensile strain, as can occur when (Al,In,Ga,B)N layers of dissimilar composition (and therefore different lattice constants) are grown in a nitride heterostructure. For example, a strained AlGaN layer on a GaN template will have in-plane tensile strain, and a strained InGaN layer on a GaN template will have in-plane compressive strain, both due to lattice matching to the GaN. Therefore, for an InGaN quantum well on GaN, the piezoelectric polarization will point in the opposite direction than that of the spontaneous polarization of the InGaN and GaN. For an AlGaN layer latticed matched to GaN, the piezoelectric polarization will point in the same direction as that of the spontaneous polarization of the AlGaN and GaN.

The advantage of using semipolar planes over c-plane nitrides is that the total polarization will be reduced. There may even be zero polarization for specific alloy compositions on specific planes. The important point is that the polarization will be reduced compared to that of c-plane nitride structures.

Bulk crystals of GaN are not readily available, so it is not possible to simply cut a crystal to present a surface for subsequent device regrowth. Commonly, GaN films are initially grown heteroepitaxially, i.e. on foreign substrates that provide a reasonable lattice match to GaN. Common substrate materials are sapphire ($Al_2O_3$) and spinel ($MgAl_2O_4$).

Large crystals of such substrate materials may be made by those practiced in the art. The crystals are then cut into substrate wafers, where the wafer surface has a specific crystallographic orientation, conventionally specified by Miller indices (hkl). Typically, low index crystal orientations are chosen which match the crystal symmetry of the material to be deposited on them. For example, (0001) sapphire substrates, which possess a hexagonal in-plane symmetry, are used for the growth of conventional polar nitride layers, which also possess a hexagonal in-plane symmetry. The existence of a crystallographic relationship between the substrate and deposited layer or layers is termed epitaxy.

Further, the heteroepitaxial growth of a nitride layer on a foreign substrate must first begin from small nuclei consisting of a few atoms. The energy of nuclei formed on a flat atomic surface is higher than that of nuclei formed at atomic steps or kinks, because the steps or kinks minimize the surface energy of the nuclei. Intentionally miscutting the substrate crystal away from a low index plane (hkl) produces step edges and kinks. Such a miscut surface orientation is termed a vicinal surface.

FIG. 1 shows a schematic representation of a vicinal surface with atomic steps or kinks. The miscut angle, β, is defined as the angle between the surface normal, n, and the primary crystal orientation [uvw], denoted by g. Substrates may be cut from a bulk crystal by those practiced in the art with a specific magnitude of miscut angle. Further, the direction of the miscut vector g may be specified relative to a specific in-plane crystallographic direction [uvw], as denoted by the angle α in FIG. 1.

Semipolar GaN planes have been demonstrated on the sidewalls of patterned c-plane oriented stripes. Nishizuka et al. [1] have grown {11-22} InGaN quantum wells by this technique. They have also demonstrated that the internal quantum efficiency of the semipolar plane {11-22} is higher than that of the c-plane, which results from the reduced polarization.

However, Nishizuka et al.'s method of producing semipolar planes is drastically different from that of the present invention, because it relies on an artifact of the Epitaxial Lateral Overgrowth (ELO) technique. ELO is a cumbersome processing and growth method used to reduce defects in GaN and other semiconductors. It involves patterning stripes of a mask material, often silicon dioxide ($SiO_2$) for GaN. The GaN is then grown from open windows between the mask and then grown over the mask. To form a continuous film, the GaN is then coalesced by lateral growth. The facets of these stripes can be controlled by the growth parameters. If the growth is stopped before the stripes coalesce, then a small area of semipolar plane can be exposed, typically 10 μm wide at most, but this available surface area is too small to process into a semipolar LED. Furthermore, the semipolar plane will be not parallel to the substrate surface, and forming device structures on inclined facets is significantly more difficult than forming those structures on normal planes. Also, not all nitride compositions are compatible with ELO processes and therefore only ELO of GaN is widely practiced.

The present invention discloses a method allowing for the growth of planar films of semipolar nitrides, in which a large area of (Al,In,Ga,B)N is parallel to the substrate surface, through the use of intentionally miscut substrates. For example, samples are often grown on 2 inch diameter substrates compared to the few micrometer wide areas previously demonstrated for the growth of semipolar nitrides.

A paper has been published where a thick c-plane GaN crystal was grown by HVPE, subsequently cut and polished on the {11-22} plane [2]. A light emitting diode was then grown on this plane. However, this method for fabricating a semipolar device is drastically different from the preferred embodiment of this invention. The above mentioned method uses a bulk GaN substrate for which a GaN semipolar surface has been exposed and is used for subsequent deposition of the device structure, otherwise known as homoepitaxy. One of the key features of the preferred embodiment of this invention is the use of a heteroepitaxial process, by which a substrate of a different material is used to produce a semipolar nitride film. This invention also distinguishes itself from the above mentioned process by allowing the use of a large, typically 2 inch, wafer in which the entire area is a semipolar film. This is in sharp contrast to the above mentioned method in which the semipolar film is only typically 4 mm by 10 mm is size, due to the unavailability of large area GaN crystals.

Growth of semipolar orientations of (Al, In, Ga)N thin films does not eliminate the total polarization of the semiconductor crystal; however, the growth of semipolar orientations of (Al, In, Ga)N thin films mitigates discontinuities in the total polarization along the growth direction of semiconductor device structures fabricated from these layers. Intentionally miscut substrates have been employed during the epitaxial growth of semiconductor thin films to improve surface morphology and/or crystal quality. In the case of GaN, see, for example, Hiramatsu, et al. [3], or Grudowski, et al. [4] However, the use of an intentional miscut has not been employed to control the relative orientation of the polarization field in (Al, In, Ga)N semiconductor thin films for the mitigation of polarization-related effects in (Al, In, Ga)N heterostructures.

Miscut substrates have in general been used for the growth of semiconductor thin films. This holds true for both homoepitaxy and heteroepitaxy of semiconductor films.

SUMMARY OF THE INVENTION

The present invention discloses a method for enhancing growth of a device-quality planar semipolar nitride semiconductor film comprising the step of depositing the semipolar nitride semiconductor film on an intentionally miscut substrate. The substrate may be intentionally miscut away from a low index crystal orientation and the miscut may comprise a magnitude and direction, wherein the direction and magnitude of miscut may be chosen to affect the epitaxial relationship, crystal symmetry, layer polarity, dislocation density, surface morphology and electrical properties of the semipolar nitride semiconductor film. The magnitude may vary depending on the substrate material, an orientation of the semipolar nitride semiconductor film, a type of deposition, and deposition conditions. The magnitude of the miscut may range from 0.5°-20° or preferably vary between 0.5° and 3°.

The substrate may be intentionally miscut in a <011> direction. The growth surface of the semipolar nitride semiconductor film may be more than 10 microns wide and substantially parallel to the intentionally miscut substrate's surface. The substrate for growth of the semipolar nitride semiconductor film may be intentionally miscut in a given crystallographic direction, thereby forming the intentionally miscut substrate and lowering a symmetry of the substrate. The symmetry may match the semipolar nitride semiconductor film's symmetry, resulting in a unique epitaxial relationship, such that the semipolar nitride semiconductor film contains a single crystallographic domain. The low symmetry semipolar nitride semiconductor thin film may be deposited heteroepitaxially on a higher symmetry substrate. The resulting semiconductor thin film may have a single polarization direction, resulting in improved electrical, optical, and device properties.

The intentionally miscut substrate may provide step edges or kinks that serve as preferential nucleation sites for growth of the semipolar nitride semiconductor film. The preferential nucleation sites may provide for improved layer properties, such as better coalescence of nuclei, reduced defect densities or smoother, more planar interfaces or surfaces, and improved facet stability compared to deposition on non-intentionally miscut substrates. The semipolar nitride semiconductor film deposited on the intentionally miscut substrate may have better crystallinity and reduced threading dislocations compared to the semipolar nitride semiconductor film deposited on a non-intentionally miscut substrate. The macroscopic surface roughness and faceting of the semipolar nitride semiconductor film decreases with increasing miscut angle.

The semipolar nitride semiconductor film may comprise an alloy composition of (Ga,Al,In,B)N semiconductors having a formula $Ga_nAl_xIn_yB_zN$ where $0 \leq n \leq 1$, $0 \leq x \leq 1$, $0 \leq y \leq 1$, $0 \leq z \leq 1$ and $n+x+y+z=1$. The semipolar nitride semiconductor film may be {10-11} gallium nitride and the intentionally miscut substrate may be {100} $MgAl_2O_4$ spinel substrate miscut in the <011> direction. The semipolar nitride semiconductor film may be {11-22} GaN and the intentionally miscut substrate may be {1-100} $Al_2O_3$ sapphire substrate miscut in the <0001> direction. The intentionally miscut substrate may be obtained by cutting a bulk nitride crystal along a semipolar plane and growing the semipolar nitride semiconductor film homoepitaxially on the intentionally miscut substrate. The semipolar plane may have a Nitrogen face or a Gallium face.

The method may further comprise (a) intentionally miscutting a substrate, (b) loading the substrate into a reactor, (c) heating the substrate under a flow comprising at least one of nitrogen, hydrogen or ammonia, (d) depositing the semipolar nitride semiconductor film on the heated substrate and (e) cooling the substrate under a nitrogen overpressure. The method may further comprise depositing a nucleation layer on the heated substrate and depositing the semipolar nitride semiconductor film on the nucleation layer.

A device may be fabricated using the method of the present invention. The device may be a light emitting diode having a brighter emission than a device fabricated on a non-intentionally miscut substrate.

Thus, the present invention describes a method for enhancing growth of a lower symmetry layer on a higher symmetry substrate comprising intentionally miscutting the higher symmetry substrate to match a symmetry of the lower symmetry layer and depositing the lower symmetry layer heteroepitaxially on the intentionally miscut substrate.

BRIEF DESCRIPTION OF THE DRAWINGS

Referring now to the drawings in which like reference numbers represent corresponding parts throughout.

DETAILED DESCRIPTION OF THE INVENTION

In the following description of the preferred embodiment, reference is made to the accompanying drawings which form a part hereof, and in which is shown by way of illustration a specific embodiment in which the invention may be practiced. It is to be understood that other embodiments may be utilized and structural changes may be made without departing from the scope of the present invention.

Overview

Figure 1:
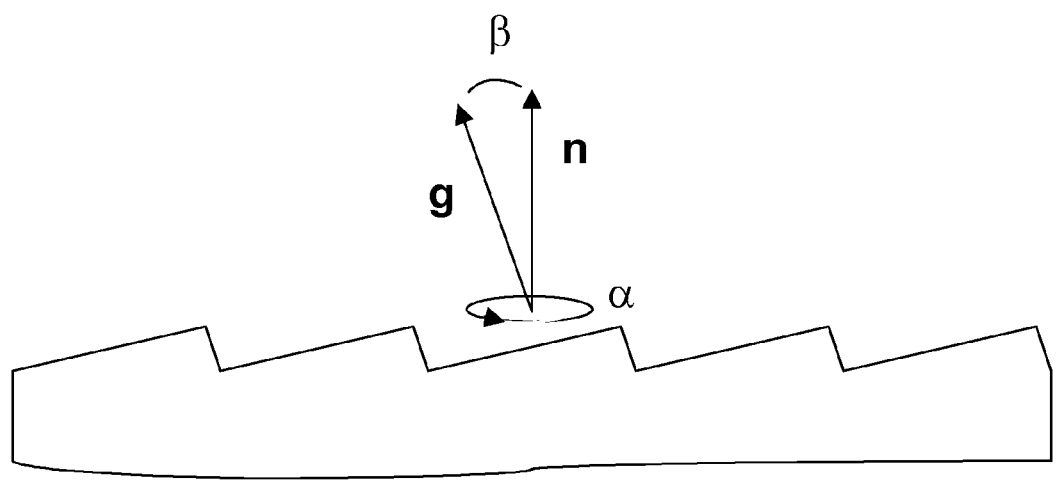
FIG. 1 is a schematic representation of a miscut substrate.

The present invention describes a method for growing semipolar nitride semiconductor films via techniques comprising, but not limited to, MOCVD, HVPE or MBE, on {100} $MgAl_2O_4$ (spinel) substrates miscut in the <011> direction and on {1-100} (m-plane) $Al_2O_3$ (sapphire) substrates miscut in the <0001> direction. The use of an intentionally miscut substrate provides step edges and/or kinks, as shown in FIG. 1, that serve as preferential nucleation sites for the growth of semipolar nitride layers. This, in turn, leads to improved layer properties, comprising, but not limited to, coalescence of nuclei, reduced defect densities, and smooth, planar interfaces, and stabilization of the desired semipolar facet. These properties are desirable for semiconductor devices made from semipolar nitride layers.

Additionally, the application of an intentional miscut in a given crystallographic direction, as shown in FIG. 1, may lower the symmetry of the substrate used for the growth of semipolar nitride layers relative to the symmetry of the non-intentionally miscut substrate. Symmetry matching of the intentionally miscut substrate to the semipolar nitride layer results in a unique epitaxial relationship, such that the semipolar nitride layer contains a single crystallographic domain.

Technical Description

The present invention discloses a method of growing high quality semipolar nitride layers using intentionally miscut substrates. Examples of this are {10-11} GaN films deposited on {100} $MgAl_2O_4$ spinel substrate miscut in the <011> direction and {11-22} GaN films deposited on {1-100} $Al_2O_3$ sapphire substrate miscut in the <0001> direction. Due to the lower symmetry of the {1-100} crystal surface, a miscut towards or away from the {1-102} sapphire plane may be specified depending on the desired result.

In one embodiment of the invention, the magnitude of the miscut varied from 0.5° to 3.0°, other substrate materials, substrate orientations, miscut angles, and miscut directions may be used without differing from the scope of the present invention, comprising, but not limited to, a range of 0.5°-20°.

Further, due to unavoidable manufacturing tolerances, the miscut angle and direction may vary by a small amount relative to the intended miscut angle and direction. The miscut magnitudes and directions described herein refer to intended values, and small differences are assumed without departing from the scope of the present invention.

In addition, due to manufacturing tolerances, almost all deposition of nitride layers occurs on a vicinal surface. The scope of the present invention includes all deposition of semipolar nitride layers where the miscut of the substrate is intentionally controlled to result in improved material and/or device properties.

These films were grown using a commercially available MOCVD system. A general outline of growth parameters for {10-11} GaN is a pressure between 10 torr and 1000 torr, and a temperature between 400° C. and 1400° C. This variation in pressure and temperature is indicative of the stability of the growth of GaN using a suitable substrate. The epitaxial relationships and conditions should hold true regardless of the type of reactor. However, the reactor conditions for growing these planes will vary according to individual reactors and growth methods (HVPE, MOCVD, and MBE, for example).

Process Steps

Figure 2:
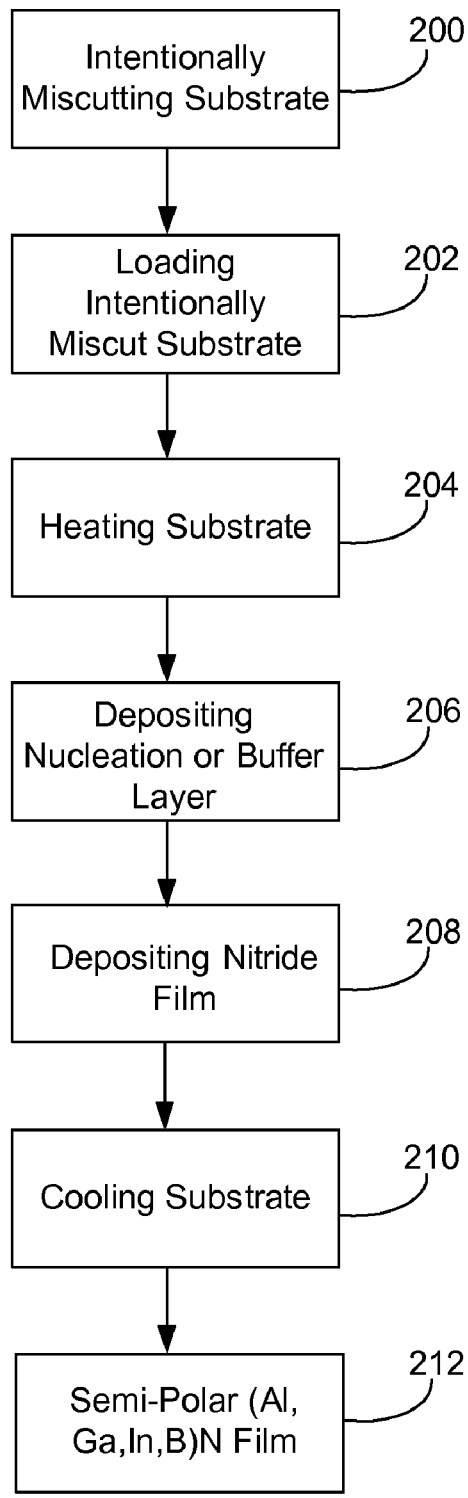
FIG. 2 is a flowchart illustrating the method of the present invention and the process steps used in embodiments of the present invention.
Figure 3A:
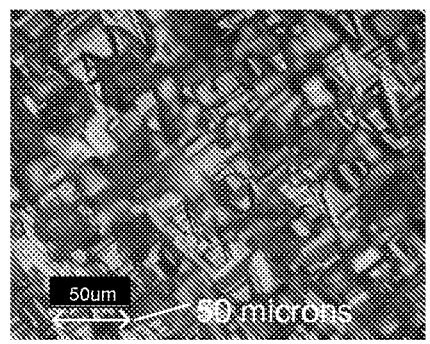
FIGS. 3(*a*), (*b*), (*c*) and (*d*) are optical micrographs of semipolar nitride layers deposited on miscut substrates, wherein the substrate in FIG. 3(*a*) is not-intentionally miscut, the substrate in FIG. 3(*b*) has a miscut angle β of 0.5 degrees, the substrate in FIG. 3(*c*) has a miscut angle β of 1.5 degrees, and the substrate in FIG. 3(*d*) has a miscut angle β of 3.0 degrees.
Figure 3B:
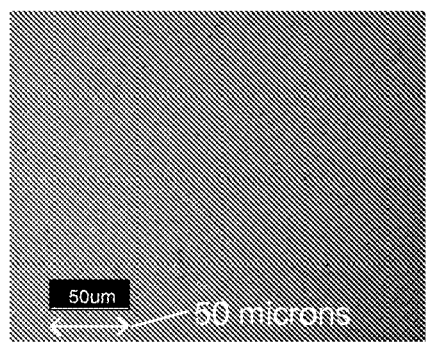
Figure 3C:
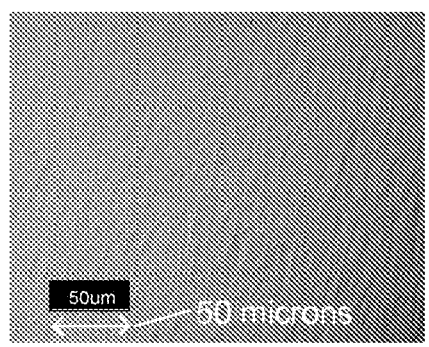
Figure 3D:
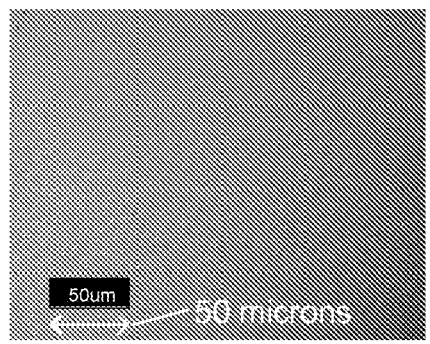

FIG. 2 is a flowchart that illustrates a method for enhancing growth of a device-quality planar semipolar nitride semiconductor thin film comprising growing the semipolar nitride semiconductor film on an intentionally miscut substrate. The method can also be used for depositing any semipolar nitride film using any suitable substrate.

Block 200 represents the step of intentionally miscutting a substrate.

Block 202 represents the step of loading the intentionally miscut substrate into a deposition or growth chamber, such as an HVPE, MOCVD or MBE reactor, for example.

Block 204 represents the step of heating the intentionally miscut substrate, typically with nitrogen and/or hydrogen and/or ammonia flowing over the substrate at atmospheric pressure.

Block 206 represents the step of depositing a nucleation or buffer layer on the intentionally miscut substrate.

Block 208 represents the step of depositing a semipolar nitride semiconductor film on the buffer layer, nucleation layer, or directly on the intentionally miscut substrate.

Block 210 represents the step of cooling the substrate, for example under nitrogen or ammonia overpressure.

Block 212 shows how the method may result in the formation of a semipolar (Al, Ga, In, B)N film.

Note that steps in FIG. 2 may be omitted or additional steps may be added as desired.

In particular, the method of FIG. 2 may be applied to the MOCVD process for the growth of semipolar GaN thin films on spinel or sapphire substrates according to the preferred embodiments of the present invention.

For the growth of {10-11} GaN, a (100) spinel substrate is used with a miscut in the <011> direction, as represented in Block 200. The substrate is loaded into an MOCVD reactor, as represented in Block 202. The reactor's heater is turned on and ramped to 1150° C. under conditions to encourage nitridization of the surface of the substrate, as represented in Block 204. Generally, nitrogen and/or hydrogen and/or ammonia flows over the substrate at atmospheric pressure during this step. Once the set point temperature is reached, the ammonia flow is set to 0.1 to 3.0 slpm. After 1 to 20 minutes, the reactor set point temperature is then increased to 1190° C., the reactor pressure is reduced to 76 torr, and 0 to 3 sccm of Trimethylgallium (TMGa) and/or 20 sccm of Trimethylaluminum (TMAl) are introduced into the reactor to initiate the $Al_xGa_{1-x}N$ buffer or nucleation layer growth, as represented in Block 206. After 1-40 minutes, the $Al_xGa_{1-x}N$ nucleation layer reaches the desired thickness. At this point, the TMAl flow is shut off and TMGa is increased to 9.5 sccm for approximately 1 to 4 hours of GaN growth, as represented in Block 208. Once the desired GaN thickness is achieved, the TMGa flow is interrupted and the reactor is cooled down while flowing ammonia to preserve the GaN film, as represented in Block 210.

In a second preferred embodiment, the growth of {11-22} GaN, a {1-100} sapphire substrate is used with a miscut in the <0001> direction, as represented in Block 200. The substrate is loaded into an MOCVD reactor, as represented in Block 202. The heater is turned on and ramped to 1150° C., with, generally, nitrogen and/or hydrogen and/or ammonia flowing over the substrate at atmospheric pressure, as represented in Block 204. After 1 to 20 minutes, the reactor set point temperature is then decreased to 700° C., the ammonia flow is set to 0.1 to 3.0 slpm, and 0 to 3 sccm of trimethylgallium (TMGa), and/or 0 to 100 sccm trimethylindium (TMI), and/or 0 to 20 sccm of trimethylaluminum (TMAl) are introduced into the reactor to initiate the $Al_xIn_yGa_{1-x-y}N$ buffer layer growth, as represented in Block 206. After 1-40 minutes the $Al_xIn_yGa_{1-x-y}N$ nucleation layer reaches the desired thickness. At this point the TMAl and/or TMI and/or TMG flows are shut off, the temperature is increased to 1185° C. and TMGa is increased to 15 sccm for approximately 1 to 4 hours of GaN growth, as represented in Block 208. Once the desired GaN thickness is achieved, TMGa flow is interrupted and the reactor is cooled down while flowing ammonia to preserve the GaN film, as represented in Block 210.

Possible Modifications and Variations

The scope of the present invention covers more than just the particular example cited. This idea is pertinent to all nitrides on any semipolar plane. For example, one could grow {10-11} AlN, InN, AlGaN, InGaN, or AlInN on a miscut (100) spinel substrate. Another example is that one could grow {10-12} nitrides, if the proper substrate, such as {10-14} 4H—SiC, is used. Further, it has been shown the semipolar {10-13} and {11-22} semipolar orientations of GaN may be deposited on (10-10) sapphire where the in plane epitaxial relationship of the two orientations differs by a rotation of 90° with respect to substrate. Therefore, it would be expected that improvements in the deposition of these two differing orientations would require the use of differing miscut directions applied to the same substrate.

Any substrate suitable for the growth of semipolar nitride layers may be miscut to improve the quality of the deposited nitride layers. Although this invention refers specifically to the heteroepitaxial growth of semipolar nitride layers, intentional miscut may also be used to improve the growth of semipolar nitride layers on bulk GaN and AlN substrates. Thus, semipolar films could also be grown homoepitaxially if a GaN or AlN substrate were provided. Any bulk growth techniques could be used, for example, ammonothermal, flux, high pressure, and HVPE. Bulk crystals could be grown in any orientation, (e.g. semipolar, non polar and polar) and subsequently cut and polished on a semipolar plane for subsequent homoepitaxy.

These examples and other possibilities still incur all of the benefits of planar semipolar films. This idea covers any growth technique that generates a planar semipolar nitride film by using a starting substrate intentionally miscut away from a low index crystal orientation, wherein the miscut may include both a specified magnitude and/or crystallographic direction.

The magnitude of the miscut angle β may vary depending on the specific substrate material used, the specific semipolar nitride orientation of the deposited layer, the type of deposition technique used, and optimal deposition conditions used. For example, the nuclei formed during the MOCVD growth of a GaN layer may be expected to be smaller than the nuclei formed during the HVPE growth of a GaN layer. Therefore, larger miscut angle, which results in a higher density of step edges, may be advantageous for MOCVD growth relative to HVPE growth.

In the preferred embodiment of this invention, the direction of the miscut is chosen to lower the symmetry of the substrate such that it matches that of the nitride layer. For example, the 4-fold symmetry of (100) spinel is reduced by a miscut in a <011> direction. This results in the formation of a single domain nitride layer with the GaN [0001] direction aligned with the miscut direction, rather than 4 domains aligned with each of the in-plane <011> directions. Consequently, negative polarization-related effects, which result from the variation in the direction of the polarization field, are removed. Although this invention refers specifically to the growth of semipolar nitride layers, this technique may be used for any material system where a low symmetry layer is deposited heteroepitaxially on a higher symmetry substrate.

In the second preferred embodiment of this invention, the direction of the miscut is chosen to affect the crystal quality and surface morphology of the semipolar nitride layer. However, the direction and magnitude of miscut may be chosen to affect any and or all of the crystal properties of the deposited nitride layer including, but not limited to, the epitaxial relationship, crystal symmetry, layer polarity, dislocation density, surface morphology and/or electrical properties.

The reactor conditions will vary by reactor type and design. The growth described above describes only one set of conditions that has been found to be useful for the growth of semipolar GaN. Other conditions may also be useful for such growth. Specifically, it has also been discovered that these films will grow under a wide parameter space of pressure, temperature, gas flows, and etc., all of which will generate a planar semipolar nitride film.

There are other steps that could vary in the growth process. It has been found that nitridizing the substrate improves surface morphology for some films, and determines the actual plane grown for other films. However, this may or may not be necessary for any particular growth technique.

The preferred embodiment described the growth of a GaN film on a (100) spinel substrate miscut in a <011> direction and comprising an AlGaN nucleation layer. The use and composition of the nucleation layer is representative of the deposition technique and system used. However, differing techniques may be used to achieve similar results. In addition, the structure grown upon the nucleation layer may consist of multiple layers having varying or graded compositions. The majority of nitride devices consist of heterostructures containing layers of dissimilar (Al,Ga,In,B)N composition. The present invention can be used for the growth of any nitride alloy composition and any number of layers or combination thereof, for example, the semipolar nitride semiconductor thin films may comprise an alloy composition of (Ga,Al,In,B)N semiconductors having a formula $Ga_nAl_xIn_yB_zN$ where $0 \leq n \leq 1$, $0 \leq x \leq 1$, $0 \leq y \leq 1$, $0 \leq z \leq 1$ and $n+x+y+z=1$. Dopants, such as Fe, Si, and Mg, are frequently doped into nitride layers. The incorporation of these and other dopants not specifically listed is compatible with the practice of this invention.

Advantages and Improvements

The existing practice is to grow GaN with the c-plane normal to the surface. This plane has a spontaneous polarization and piezoelectric polarization which are detrimental to device performance. The advantage of semipolar over c-plane nitride films is the reduction in polarization and the associated increase in internal quantum efficiency for certain devices.

Nonpolar planes could be used to completely eliminate polarization effects in devices. However, these planes are quite difficult to grow, thus nonpolar nitride devices are not currently in production. The advantage of semipolar over nonpolar nitride films is the ease of growth. It has been found that semipolar planes have a large parameter space in which they will grow. For example, nonpolar planes will not grow at atmospheric pressure, but semipolar planes have been experimentally demonstrated to grow from 62.5 torr to 760 torr, but probably have an even wider range than that.

The advantage of planar semipolar films over ELO sidewall is the large surface area that can be processed into an LED or other device. Another advantage is that the growth surface is parallel to the substrate surface, unlike that of ELO sidewall semipolar planes.

The use of an intentionally miscut (100) spinel substrates for the growth of semipolar nitride layers has been shown to produce smoother semipolar nitride layers relative to non-intentionally miscut substrates. Additionally, the use of an intentional miscut in the <011> direction, parallel to the projected GaN [0001] direction, has been shown to result in single domain nitride layers relative to substrates with non-intentional miscuts and/or miscuts in directions other than <011>.

FIG. 3 shows how symmetry matching of the intentionally miscut substrate to the semipolar nitride semiconductor film's symmetry results in a unique epitaxial relationship, such that the semipolar nitride semiconductor thin film contains a single crystallographic domain. For example, FIG. 3(a) shows the surface morphology of a (10-11) oriented semipolar GaN film grown on a non-intentionally miscut (100) spinel substrate. The film is comprised of numerous, non-coalesced islands. Additionally, multiple crystal domains, rotated 90 degrees with respect to one another, are visible. The intentional application of a miscut greater than 0.5 degrees in a <011> direction to the (100) spinel substrate, results in fully coalesced GaN films with a single crystallographic domain, as seen in FIGS. 3(b), 3(c) and 3(d), wherein the miscut β in FIG. 3(b) is 0.5 degrees, the miscut β in FIG. 3(c) is 1.5 degrees, and the miscut β in FIG. 3(d) is 3.0 degrees. Further, macroscopic surface roughness and faceting decreases with increasing miscut angle, resulting in smooth surfaces suitable for the growth and fabrication of nitride based light emitting diodes, laser diodes, field-effect transistors, and other device structures. Thus FIG. 3 shows how the preferential nucleation sites on the miscut substrate provide for improved layer properties, such as coalescence of nuclei and smoother, planar interfaces or surfaces compared to deposition on non-intentionally miscut substrates.

Figure 4:
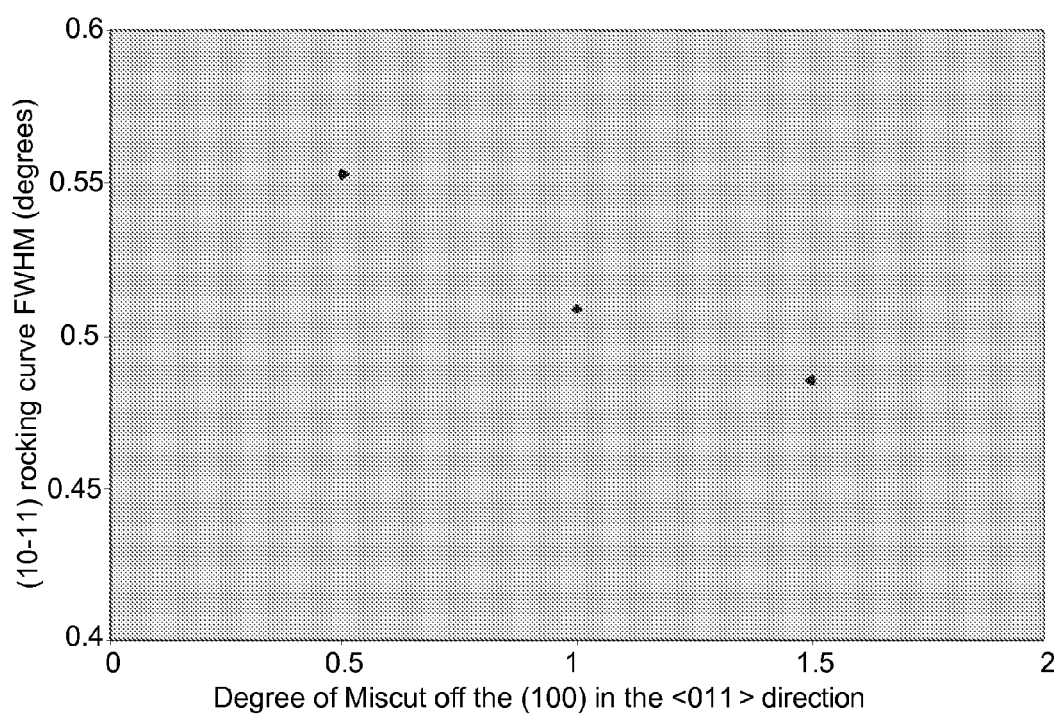
FIG. 4 is a graph illustrating the full width at half-maximum (FWHM) of the (10-11) x-ray rocking curve versus substrate miscut angle β.

The crystal quality of deposited semiconductor films may be measured by high-resolution x-ray diffraction rocking curve measurements. The full width at half-maximum (FWHM) of a suitable x-ray diffraction peak indicates the relative crystal mosaic and defect density of layers being examined. In addition to improved coalescence and surface morphology, the FWHM of the on-axis (10-11) reflection decreases with increasing miscut angle, as observed in FIG. 4. This indicates a reduction in the threading dislocations generated by the heteroepitaxial crystal deposition, for semipolar nitride layers deposited on intentionally miscut substrates.

Figure 5:
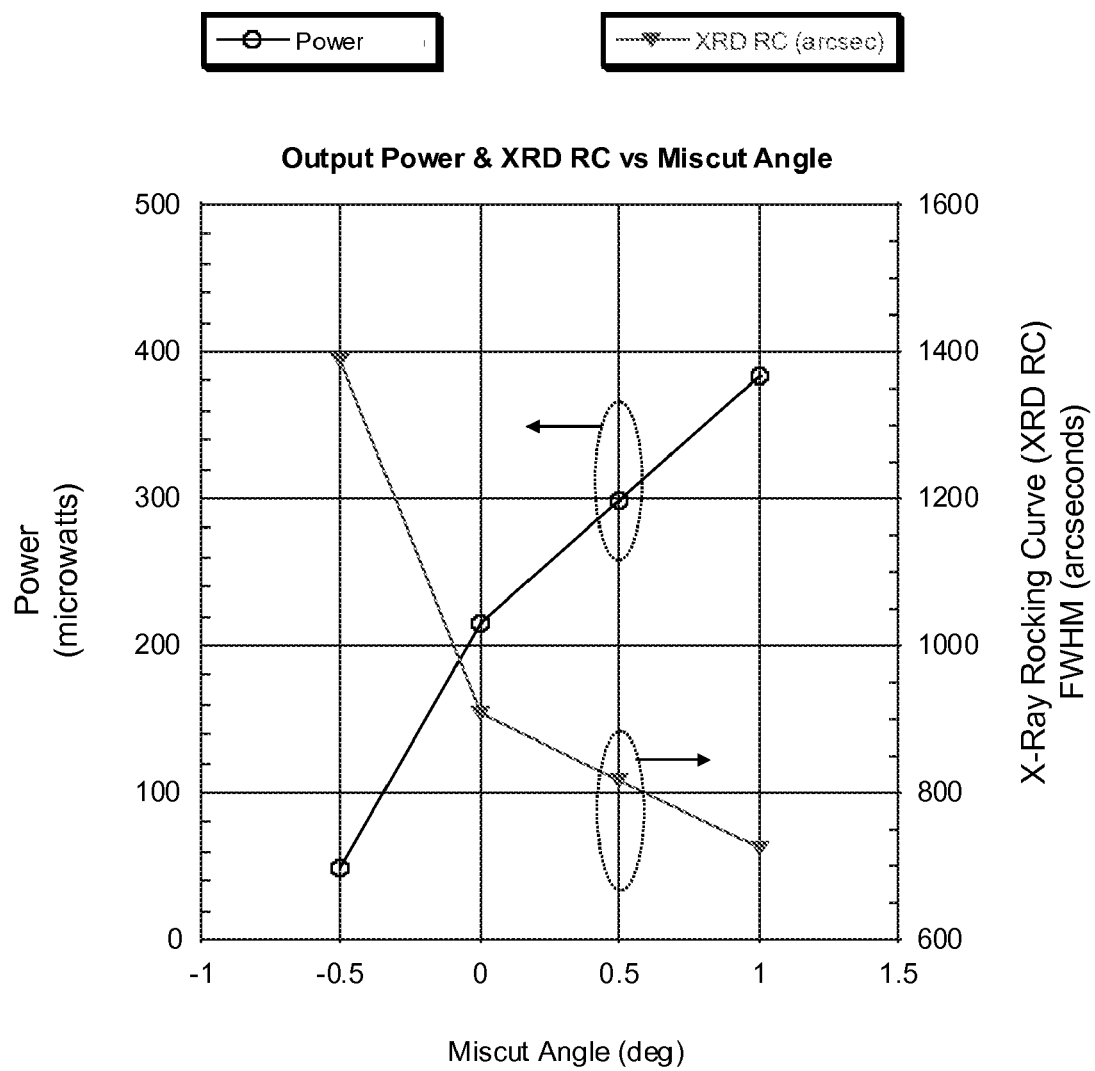
FIG. 5 is a graph illustrating output power (measured in microwatts) and FWHM of the (11-22) x-ray rocking curve (measured in arcseconds) as a function of substrate miscut angle.

In addition, in the second preferred embodiment of this invention, the use of an intentionally miscut {1-100} sapphire substrate for the growth of semipolar {11-22} nitride layers has been shown to produce better semipolar nitride layers relative to non-intentionally miscut substrates. The crystalline quality measured by x-ray diffraction in terms of the FWHM of the {11-22} rocking curve also shows that films on intentionally miscut {1-100} sapphire substrate have better crystallinity than non-intentionally miscut substrates, as shown in FIG. 5. At the same time, the output power from light-emitting diodes (LEDs) fabricated on the films grown on an intentionally miscut sapphire substrate have shown brighter emission than on non-intentionally miscut substrates, as shown in FIG. 5.

Benefits incurred by using semipolar planes for optoelectronic devices may be a function of the planes being Gallium (Ga) face or Nitrogen (N) face. There is improved output power for light emitting devices, grown on semipolar planes using the method of the present invention, but it is unclear whether the semipolar plane on which the device is grown is {1 1 -2 2} Ga face or {1 1 -2 -2} N face. At this stage, it is believed N-face may have some benefits that are not yet well understood. The exposed surface of the semi polar plane after deposition on the miscut substrate is N face or Ga face, and a device may be deposited on the N face or Ga face.

The use of intentionally miscut {1-100} sapphire for the growth of semipolar GaN may also be used to stabilize surface facets other than {11-22}. For example, large {10-11} facets may be stabilized. These facets allow further control of the orientation of the polarization field, increase the device area, and may improve light extraction in optoelectronic devices. [11]

REFERENCES

The following references are incorporated by reference herein:

[1] Nishizuka, K., Applied Physics Letters, Vol. 85 Number 15, 11 Oct. 2004. This paper is a study of {1122} GaN sidewalls of ELO material.

[2] M. Funato, M. Ueda, Y. Kawakami, Y. Naruka, T. Kosugi, M Takahashi, and T. Mukai, Japn. J. of Appl. Phys. 45, L659 (2006). This paper describes the growth of semipolar light emitting diodes grown on bulk semipolar GaN.

[3] K. Hiramatsu, H. Amano, I. Akasaki, H. Kato, N. Koide, and K. Manabe, J. of Cryst. Growth 107, 509 (1991). This paper describes the use of a miscut substrate to improve the surface morphology of polar GaN.

[4] P. A. Grudowski, A. L. Holmes, C. J. Eiting, and R. D. Dupuis, Appl. Phys. Lett. 69, 3626 (1996). This paper describes the use of a miscut substrate to improve the photoluminescence of polar GaN.

[5] H. Amano, N. Sawaki, I. Akasaki and Y. Toyoda, Applied Physics Letters Vol. 48 (1986) pp. 353. This paper describes the use of an AlN buffer layer for improvement of GaN crystal quality.

[6] S. Nakamura, Japanese Journal of Applied Physics Vol. 30, No. 10A, October, 1991, pp. L1705-L1707. This paper describes the use of a GaN buffer layer for improvement of GaN crystal quality.

[7] D. D. Koleske, M. E. Coltrin, K. C. Cross, C. C. Mitchell, A. A. Allerman, Journal of Crystal Growth Vol. 273 (2004) pp. 86-99. This paper describes the effects of GaN buffer layer morphology evolution on a sapphire substrate.

[8] B. Moran, F. Wu, A. E. Romanov, U. K. Mishra, S. P. Denbaars, J. S. Speck, Journal of Crystal Growth Vol. 273 (2004) pp. 38-47. This paper describes the effects of AlN buffer layer morphology evolution on a silicon carbide substrate.

[9] U.S. Pat. No. 4,855,249, issued on Aug. 8, 1989, to Akasaki, et al., and entitled "Process for growing III-V compound semiconductors on sapphire using a buffer layer."

[10] U.S. Pat. No. 5,741,724, issued on Apr. 21, 1998, to Ramdani, et al., and entitled "Method of growing gallium nitride on a spinel substrate.";

[11] J. F. Kaeding, Ph.D. Thesis, University of California, Santa Barbara, January 2007. "The heteroepitaxial growth of semipolar GaN for Light Emitting Diodes." This work describes the use of miscut substrates for the growth of semipolar GaN.

CONCLUSION

This concludes the description of the preferred embodiment of the present invention. The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A crystal, comprising (Al,In,Ga,B)N or III-nitride and a surface perpendicular to a growth direction of the crystal, wherein:
   the surface is at least 10 micrometers wide,
   the surface has a semi-polar orientation, and
   the crystal has a crystalline quality characterized by a rocking curve having a full width at half maximum (FWHM) of less than 0.55 degrees as measured by X-ray Diffraction.

2. The crystal of claim 1, wherein the FWHM is less than 900 arcseconds.

3. The crystal of claim 1, wherein the surface is planar.

4. The crystal of claim 1, wherein the surface is a largest surface of the crystal.

5. The crystal of claim 1, further comprising a semi-polar III-nitride light emitting diode fabricated on the surface that emits light with an output power of more than 220 microwatts.

6. The crystal of claim 1, wherein the crystal contains a single crystallographic domain.

7. The crystal of claim 1, wherein:
   the crystal is on a miscut surface of a substrate, and the surface is oppisite a side of the crystal adjacent to the miscut surface.

8. The crystal of claim 7, wherein the miscut surface of the substrate is miscut away from a low index crystal orientation of the substrate.

9. The crystal of claim 8, wherein:
   the miscut surface is oriented at a miscut angle with respect to a primary crystal orientation of the substrate, and
   the miscut angle is between 0.5°-20°.

10. The crystal of claim 8, wherein the miscut angle is between 0.5°-3°.

11. The crystal of claim 7, wherein the crystal is deposited heteroepitaxially on the substrate.

12. The crystal of claim 11, wherein:
    the semi-polar orientation is {10-11},
    the substrate is a {100} MgAl$_2$O$_4$ spinel substrate, and
    the miscut surface is oriented at a miscut angle with respect to the {100} orientation of the spinel substrate and in a <011> direction.

13. The initial crystal of claim 11, wherein:
    the semi-polar orientation is {11-22},
    the substrate is a {1-100} Al$_2$O$_3$ sapphire substrate, and
    the miscut surface is oriented at a miscut angle with respect to the {1-100} orientation of the sapphire substrate and in a <0001> direction.

14. The crystal of claim 7, wherein the substrate is Gallium Nitride (GaN).

15. The crystal of claim 7, wherein the substrate is sapphire.

16. The crystal of claim 7, wherein the substrate is spinel.

17. The crystal of claim 7, wherein the substrate is silicon carbide.

18. The crystal of claim 7, wherein the substrate is aluminum nitride.

19. The film of claim 7, wherein:
    the crystal has a reduced defect density, and
    the surface is smoother,
    as compared to an (Al,In,Ga,B)N or III-nitride crystal deposited on a surface of the substrate that is different from the miscut surface.

20. The crystal of claim 7, wherein the crystal is part of a III-nitride light emitting device having a brighter emission than a similar device fabricated on a surface of the substrate that is different from the miscut surface.

21. The crystal of claim 1, wherein the crystal is part of a light emitting device comprising InN, AlGaN, InGaN, or AlInN.

22. The crystal of claim 7, wherein the miscut surface is an intentionally miscut surface.

23. The crystal of claim 1, wherein the semi-polar orientation is {11-22}.

24. The crystal of claim 1, wherein the semi-polar orientation is {10-11}.

25. The crystal of claim 1, wherein the semi-polar orientation is {10-12}.

26. The crystal of claim 1, wherein the semi-polar orientation is {10-13}.

27. The crystal of claim 1, wherein the crystal is Gallium Nitride (GaN).

28. The crystal of claim 1, wherein the is Aluminum Nitride.

29. The crystal of claim 1, wherein the surface has an area of more than 4 millimeters by 10 millimeters.

30. A device structure, comprising:
   A semi-polar crystal comprising (Al,In,Ga,B)N or III-nitride, wherein:
   the semi-polar crystal is grown on a miscut surface of a substrate,
   a subsequent semi-polar III-nitride or (Al,In,Ga,B)N layer is grown on a top surface of the semi-polar crystal,
   the top surface is a grown surface opposite a side of the crystal adjacent the miscut surface of the substrate, and
   the semi-polar crystal has a crystalline quality characterized by a rocking curve having a full width at half maximum (FWHM) of less than 0.55 degrees as measured by X-ray Diffraction.

31. A method of fabricating a III-nitride crystal, comprising:
   depositing a crystal on a miscut surface of a substrate, wherein:
   the crystal comprises (Al,In,Ga,B)N or III-nitride and a surface perpendicular to a growth direction of the crystal,
   the surface is at least 10 micrometers wide,
   the surface has a semi-polar orientation, and
   the crystal has a crystalline quality characterized by a rocking curve having a full width at half maximum (FWHM) of less than 0.55 degrees as measured by X-ray Diffraction.

32. The method of claim 31, wherein:
   the depositing is by Metal Organic Chemical Vapor Deposition or Hydride Vapor Phase Epitaxy,
   a deposition pressure is between 10 torr and 1000 torr, and
   a deposition temperature is between 400° C. and 1400° C.

33. The method of claim 32, wherein the depositing uses a flow comprising at least one of nitrogen, hydrogen or ammonia.

34. The method of claim 31, further comprising selecting the miscut surface such that a III-nitride light emitting diode fabricated on the surface emits light with an output power of more than 220 microwatts.

35. The method of claim 31, wherein the miscut surface of the substrate is miscut away from a low index crystal orientation.

36. The method of claim 31, further comprising selecting the miscut surface wherein:
   the crystal has a reduced defect density, and
   the surface is smoother,
   as compared to an (Al,In,Ga,B)N or III-nitride crystal deposited on a surface of the substrate that is different from the miscut surface.

37. The method of claim 31, further comprising selecting the miscut surface wherein the crystal is part of a III-nitride light emitting device having a brighter emission than a similar device fabricated on a surface of the substrate that is different from the miscut surface.

38. The method of claim 31, further comprising polishing, cutting, or polishing and cutting a surface of the substrate to form the miscut surface.

39. The method of claim 31, further comprising depositing a semi-polar III-nitride light emitting diode on the surface, wherein the III-nitride light emitting diode emits light with an output power of more than 220 microwatts.

* * * * *